(12) United States Patent
Sato

(10) Patent No.: US 9,780,152 B2
(45) Date of Patent: Oct. 3, 2017

(54) DISPLAY DEVICE AND METHOD OF MANUFACTURING THE SAME

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/794,456

(22) Filed: Jul. 8, 2015

(65) Prior Publication Data
US 2016/0013255 A1  Jan. 14, 2016

(30) Foreign Application Priority Data
Jul. 11, 2014  (JP) .................................. 2014-143042

(51) Int. Cl.
*H01L 27/32*  (2006.01)
*H01L 51/50*  (2006.01)

(52) U.S. Cl.
CPC ...... *H01L 27/3246* (2013.01); *H01L 51/5012* (2013.01); *H01L 2251/55* (2013.01)

(58) Field of Classification Search
None
See application file for complete search history.

(56) References Cited

U.S. PATENT DOCUMENTS

| 2004/0201048 | A1 | 10/2004 | Seki et al. | |
| 2010/0214195 | A1* | 8/2010 | Ogasawara | G02F 1/136286 345/55 |
| 2012/0326201 | A1* | 12/2012 | Ohnuma | H01L 51/0085 257/99 |
| 2014/0027798 | A1* | 1/2014 | Sato | H01L 33/50 257/89 |

FOREIGN PATENT DOCUMENTS

JP  3328297 B2  9/2002

* cited by examiner

*Primary Examiner* — Jay C Chang
(74) *Attorney, Agent, or Firm* — Typha IP LLC

(57) ABSTRACT

An organic EL display device in an embodiment according to the present invention includes a plurality of first electrodes provided corresponding to each of a plurality of pixels above a first substrate, a bank layer provided above the first substrate between adjacent first electrodes to cover an end part of the first electrode, an organic EL layer provided to cover the plurality of first electrodes and the bank layer, a second electrode provided above the organic EL layer, the organic EL layer includes a first region overlapping the bank layer, and a second region overlapping the plurality of the first electrodes, and a first resistance of the first region is larger than a second resistance of the second region.

14 Claims, 18 Drawing Sheets

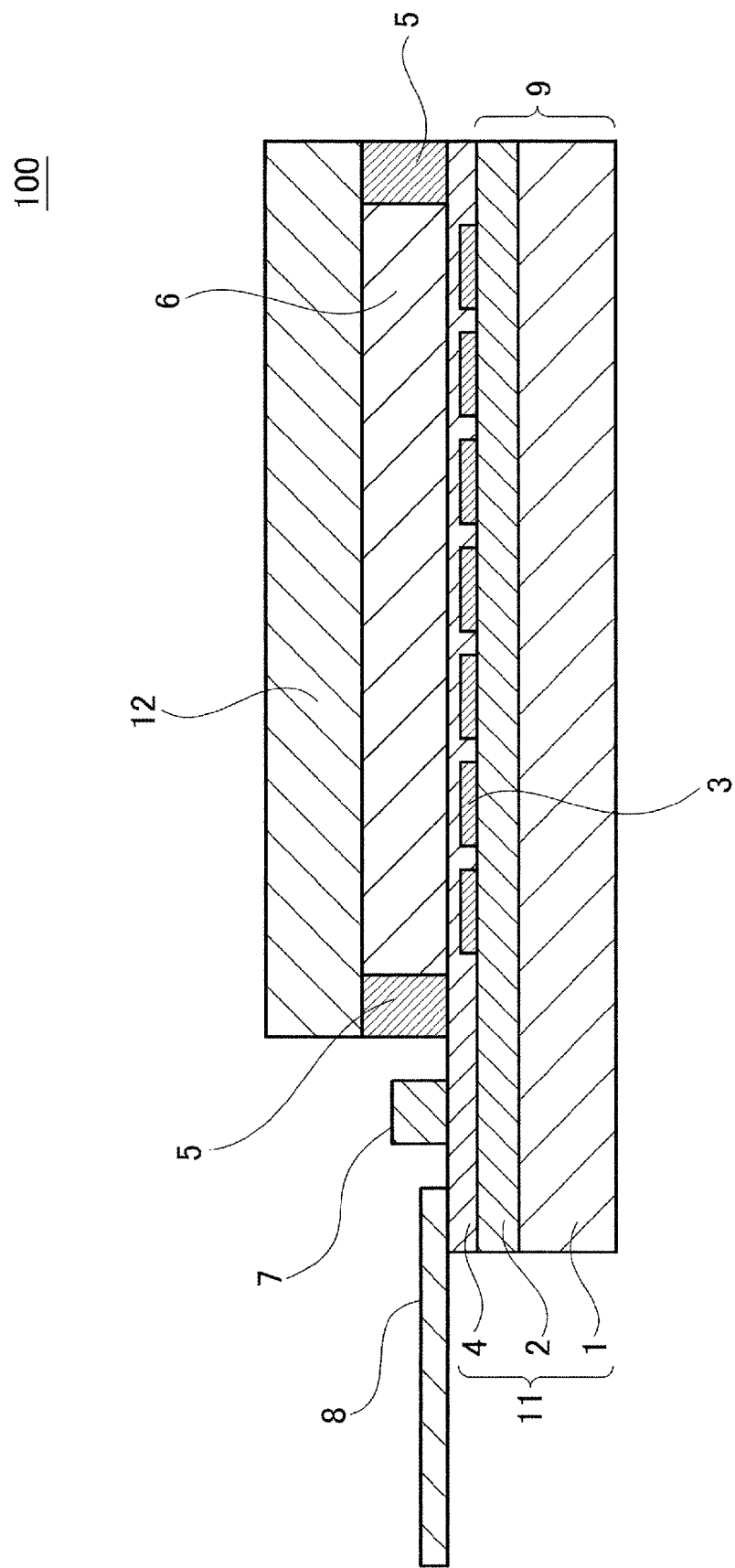

10a

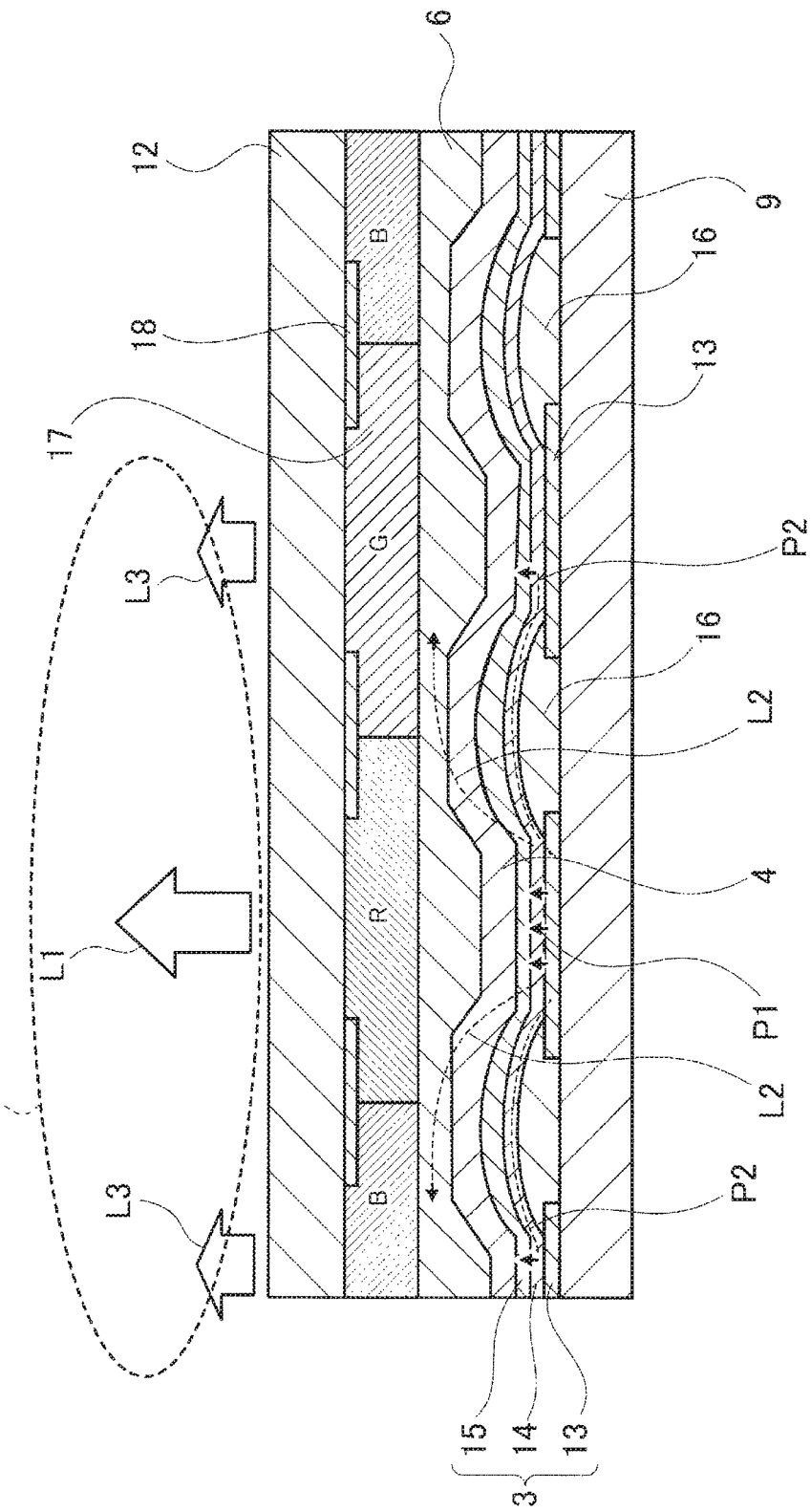

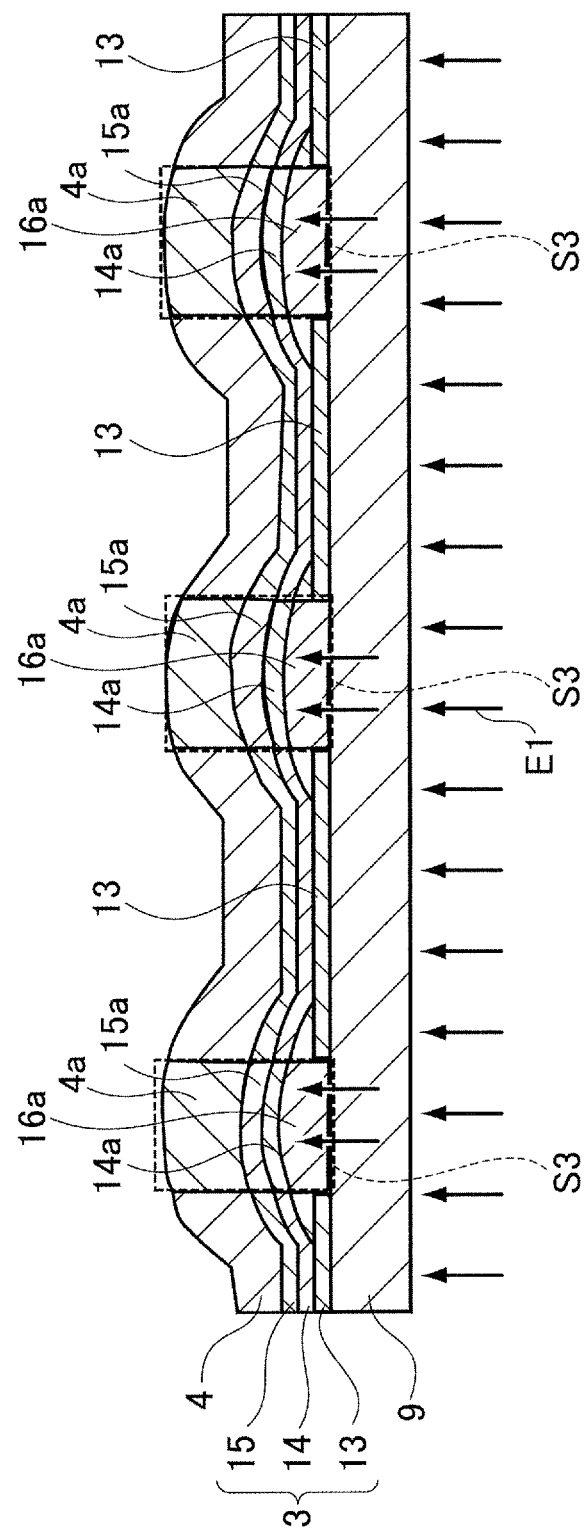

10b

DISPLAY DEVICE AND METHOD OF MANUFACTURING THE SAME

CROSS-REFERENCE TO RELATED APPLICATIONS

This application is based upon and claims the benefit of priority from the prior Japanese Patent Application No. 2014-143042, filed on Jul. 11, 2014, the entire contents of which are incorporated herein by reference.

FIELD

The present invention is related to an organic EL display device provided with an organic electroluminescence element and a method of manufacturing the display device.

BACKGROUND

An organic electroluminescence device (referred to below as "organic EL device") which uses an organic electroluminescence device realizes light emittance in each color in the visible light band by selecting an organic material or adopting an appropriate structure of an organic EL device. As a result, the development of display devices or lighting appliances using organic EL devices is progressing.

An organic EL display device is provide with an organic EL device in each pixel and the organic EL device in each pixel is connected to a transistor and light emittance is controlled via the transistor. The organic EL device us formed in a device substrate formed with transistor. An interlayer insulation layer is provided between the organic EL device and transistor in the pixel structure, and one electrode which forms the organic EL device and the source/drain of the transistor are electrically connected in a contact hole formed in the insulation layer.

An organic EL display device includes a pixel array provided with these pixels in a matrix shape, the light emitted from the organic EL device is emitted to the side of a device substrate or an opposing substrate provided facing the device substrate and thereby a display screen is formed on that surface.

The organic EL device is provided with a layer (referred to below as "organic EL layer") including an organic electroluminescence material between a pair of electrodes called an anode and cathode. As one example, the organic EL layer is formed by stacking a hole injection layer, a hole transport layer, a light emitting layer, an electron transport layer and electron injection layer and the like.

A method is known for arranging a concave shaped bank layer as a component for sectioning each pixel region provided with this type of organic EL layer and forming an organic EL layer using an inject method within a region enclosed by the bank layer. However, when miniaturization of a pixel progresses in order to realize high definition of a display device, a problem occurs whereby the material solution of the organic EL layer does not spread uniformly within the region enclosed by the bank layer and easily flows out to an adjacent pixel region. The organic EL display device disclosed in the publication of Japanese Patent No. 3328297 discloses a process for providing water repelling properties and lyophilic properties by a surface treatment of a bank layer using a plasma treatment or infrared irradiation treatment and the like.

The conventional organic EL display device described above requires a smaller liquid drop size than the aperture width of a pixel when forming an organic EL layer using and inkjet method. However, in recent organic EL display devices, since miniaturization of pixels is progressing further, there is a problem whereby the burden on the manufacturing process increases with further miniaturization of the size of liquid drops and an increase in pixel numbers. In addition, with the progress in miniaturization of pixels, when a conductive material such as a hole injection layer or charge generation layer (CGL) which form an organic EL device is provided between a plurality of pixels, a leak current flows between adjacent pixels.

SUMMARY

An organic EL display device in an embodiment according to the present invention includes a plurality of first electrodes provided corresponding to each of a plurality of pixels above a first substrate, a bank layer provided above the first substrate and located at a boundary between a pair of the first electrodes which are adjacent each other to cover end parts of the pair of the first electrodes, an organic EL layer provided to cover the plurality of first electrodes and the bank layer, a second electrode provided above the organic EL layer, the organic EL layer includes a first region overlapping the bank layer, and a second region overlapping the plurality of the first electrodes, and a first resistance of the first region is larger than a second resistance of the second region.

An organic EL display device in an embodiment according to the present invention includes a first substrate, a first pixel and a second pixel adjacent to the first pixel provided in the first substrate, a first pixel electrode provided in the first pixel, a second pixel electrode provided in the second pixel, a bank layer located at a boundary between the first electrode and the second electrode, the bank layer exposing the first pixel electrode and the second pixel electrode, an organic EL layer provided across the first pixel, the second pixel and the bank layer, a common electrode provided above the organic EL layer and across the first pixel, the second pixel and the bank layer, the organic EL layer includes a first region overlapping the bank layer and a second region overlapping the first pixel electrode in a planar view, and a resistance of the first region is larger than a second resistance of the second region.

An organic EL display device in an embodiment according to the present invention includes forming a plurality of first electrodes above a first surface of a first substrate, forming a bank layer at a boundary between a pair of the first electrodes which are adjacent each other so that the bank layer covers end parts of the pair of the first electrodes above the first surface, forming an organic EL layer above the plurality of first electrodes and the bank layer, forming a second electrode above the organic EL layer, providing the organic EL layer with a first region overlapping the bank layer and a second region overlapping the first pixel electrode in a planar view, irradiating an energy beams from a side of a second surface to the first region, the second surface facing the first surface, and making a first resistance of the first region larger than a second resistance of the second region.

BRIEF DESCRIPTION OF DRAWINGS

FIG. 2 is a cross-sectional diagram showing a schematic structure of an organic EL display device related to one embodiment of the present invention;

FIG. 5 is a cross-sectional diagram showing a schematic structure of a pixel in an organic EL display device;

FIG. 7 is a cross-sectional diagram for explaining another example of a manufacturing process of an organic EL display device related to one embodiment of the present invention;

DESCRIPTION OF EMBODIMENTS

The embodiments of the present invention are explained below while referring to the diagrams. Furthermore, the present invention is not limited to the embodiments explained below and may be realized by various modifications without departing from the scope of the invention.

Figure 1:
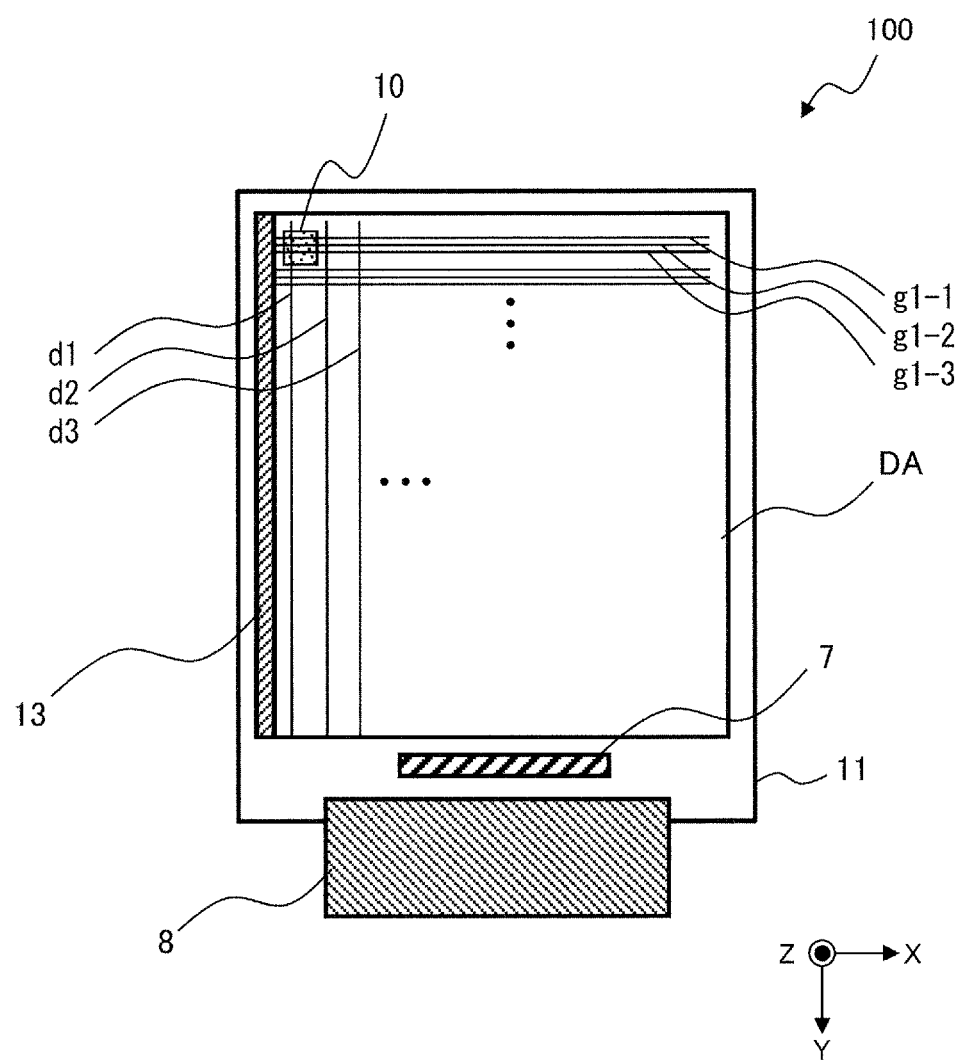
FIG. 1 is a planar diagram showing a schematic structure of an organic EL display device related to one embodiment of the present invention.

A schematic structure of an organic EL display device 100 related to an embodiment of the present invention is explained while referring to FIG. 1 and FIG. 2. FIG. 1 is planar diagram showing a schematic structure of the organic EL display device 100 and FIG. 2 is a cross-sectional diagram showing a schematic structure of the organic EL display device 100.

As is shown in FIG. 1, the organic EL display device 100 related to the present embodiment is provide with a display region DA, a driver IC 7, a FPC (flexible printed circuit) 8 and a scanning line driver circuit 13 formed above a substrate 11. A plurality of control signal lines g1-1-g1-3 running in an X direction in the diagram and a plurality of data signal lines d1-d3 running in a Y direction are provided to mutually intersect each other in the display region DA, and a plurality of pixels 10 are provided in a matrix shape in a position corresponding to an intersection part between the control signal lines g1-1-g1-3 and data signal line d1-d3.

A pixel 10 included in the display region DA is shown in FIG. 1. Although a structure in which three control signal lines g1-1-g1-3 and one data signal line d1 are provided intersecting each other for each pixel is shown as an example in FIG. 1, the present invention is not limited to this structure. In addition, although not shown in the diagram, wiring which supplies a fixed voltage such as a power supply line may be provided within the display region DA.

Light emittance of the pixel 10 is controlled by a scanning signal supplied by the control signal lines g1-1-g1-3 and a data signal supplied by the data signal line d1. Control of the light emittance is performed by a thin film transistor (TFT) provided in the pixel 10. A pixel circuit provided with a TFT and a condenser which holds a voltage supplied according to a data signal is included in the pixel 10. This pixel circuit is formed above a hard substrate 1 such as glass and forms a TFT drive circuit 2 as is shown in FIG. 2. A structure provided with the TFT drive circuit 2 above the substrate 1 is referred to below as "TFT substrate 9".

A structure in which an organic EL device 3 included in each pixel 10 is provided above the TFT substrate 9 is shown in FIG. 2. The organic EL device 3 requires sealing from the outside since it rapidly deteriorates when exposed to water within the atmosphere. As a result, the surface of the organic EL device 3 is covered for example by a transparent sealing film 4 comprised from a silicon nitride film and the like. Herein, a structure in which the organic EL device 3 and sealing film 4 formed above the TFT substrate 9 is referred to as "first substrate 11" and together with this, an opposing substrate 12 provided facing the first substrate 11 is referred to as "second substrate 12". The second substrate 12 may be provided with a color filter or provided with thin film device including a touch panel function.

As is shown in FIG. 2, in the display device 100 a transparent resin 5, 6 such as an epoxy resin is filled in a gap between the first substrate 11 and second substrate 12 in order to prevent reflection or refraction at a boundary between the first substrate 11 and second substrate 12 while maintaining the surface of the organic EL device 3 and the surface of second substrate 12 roughly parallel by maintaining a fixed distance between the first substrate 1 and second substrate 12. Specifically, the resin 5 which has a relatively high level of viscosity before curing is formed in a frame shape which encloses the display region DA and the resin 6 which has a relatively low level of viscosity before curing is filled in the space enclosed by the resin 5. Due to the different functions of the resin 5 and resin 6, the resin 5 with a relatively high level of viscosity before curing is referred to as "Dam material" below and the resin 6 with a relatively low level of viscosity is referred to as "filler material". In addition, the gap between the first substrate 11 and the second substrate 12 may be maintained by a material other than the resin 5 and resin 6 such as a known sealing material.

The pixel 10 may include a plurality of sub-pixels which each emit light in different colors. For example, one pixel 10 may be formed from each s which emits a primary color (red (R), green (G), blue (B)), or from four sub-pixels white emit white (W) or yellow (Y) in addition to a primary color (red (R), green (G), blue (B)). By selectively adjusting and driving the amount of light emitted by the organic EL device 3 in each sub-pixel included in a plurality of pixels 10, it is possible to form the display region DA in which an image is displayed.

First Embodiment

A structure of the organic EL display device 100 related to the first embodiment of the present invention is explained below while referring to FIG. 3A-3C, FIG. 4, FIG. 5, FIG. 6A-6F and FIG. 7.

Figure 3A:
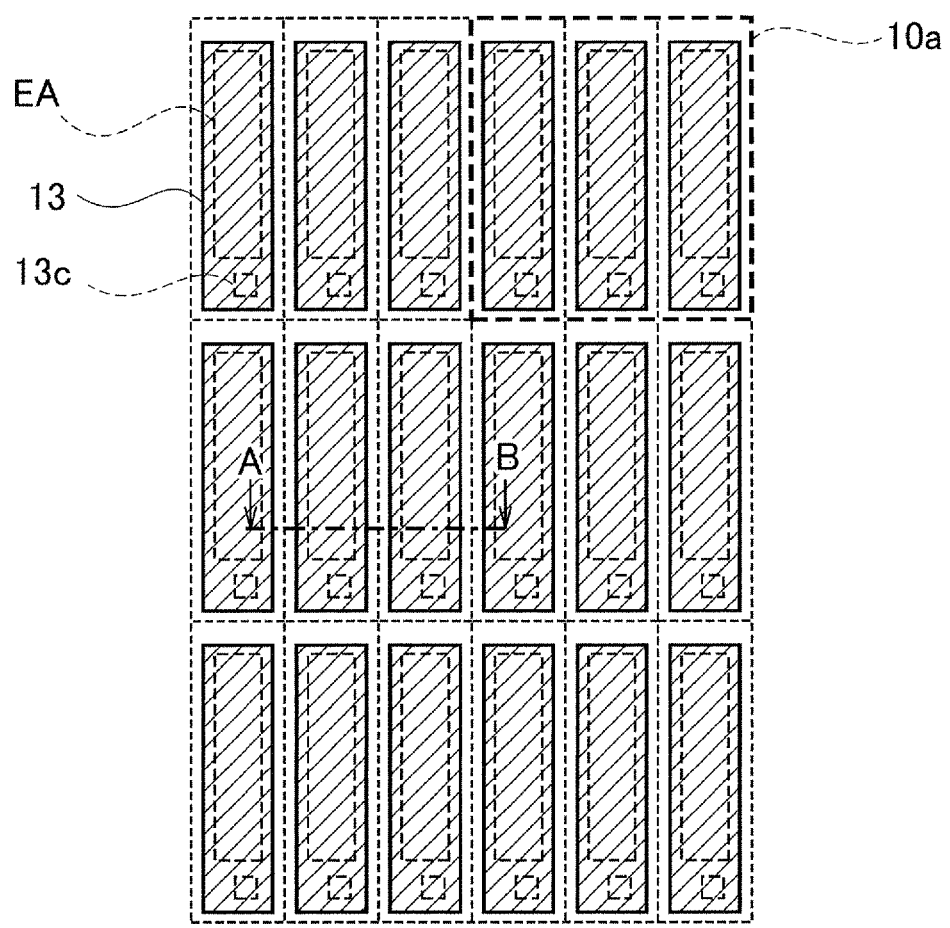
FIG. 3A is a planar diagram showing a schematic structure of a pixel in an organic EL display device related to one embodiment of the present invention.
Figure 3B:
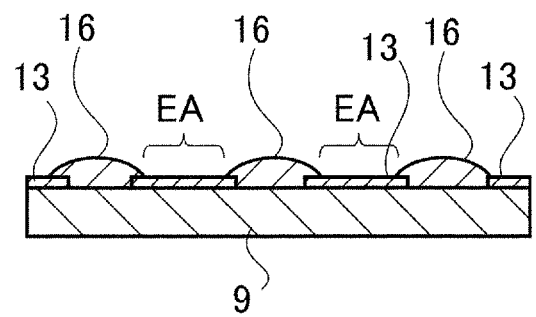
FIG. 3B is a cross-sectional diagram showing a schematic structure of a pixel in an organic EL display device related to one embodiment of the present invention.
Figure 3C:
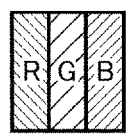
FIG. 3C is a planar diagram showing a structure of a pixel comprised from sub-pixels in an organic EL display device related to one embodiment of the present invention.

FIG. 3A-3C are diagrams showing a schematic structure of a pixel 10a included in the organic EL display device 100 related to the first embodiment of the present invention. FIG. 3A is a planar diagram showing a structure in which a first electrode 13 of the organic EL device 3 is provided for each sub-pixel, FIG. 3B is a cross-sectional diagram showing a structure of the first electrode 13 and a bank layer 16 in the line A-B shown in FIG. 3A, and FIG. 3C is a planar diagram showing a structure of a pixel 10a comprised from three primary color (red (R), green (G), blue (B)) sub-pixels. In addition, FIG. 4 is a cross-sectional diagram showing a schematic diagram of a pixel 10 in the organic EL display device related to the first embodiment of the present invention.

Figure 4:
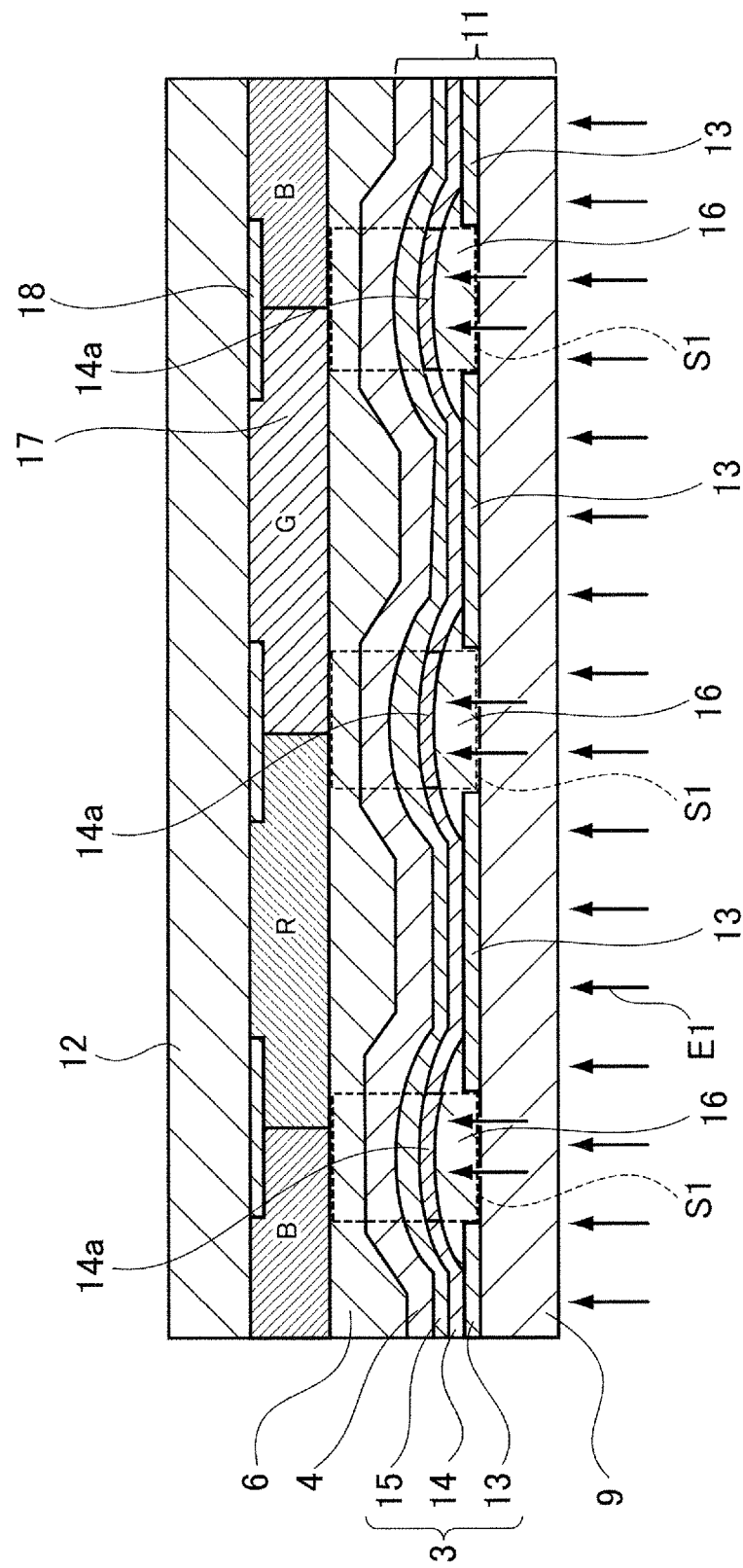
FIG. 4 is a cross-sectional diagram showing a schematic structure of a pixel in an organic EL display device related to one embodiment of the present invention.

As is shown in FIG. 3A-3C and FIG. 4, in the organic EL display device 100, the organic EL device 3 is formed by stacking an organic EL layer 14 and a second electrode (cathode) 15 above a first electrode (anode) 13 provided between a bank layer 16 and a bank layer 16 which section each sub-pixel. As is shown in FIG. 4, the second substrate 12 provided facing the first substrate 11 may be provided with a color filter 17 of each color and a black matrix 18 which sections the color filter 17 corresponding to each sub-pixel, and in the case where the color filter 17 is provided, a light emitting layer may be provided in which the organic EL layer 14 emits white light.

In the case where the organic EL display device 100 is provided with the organic EL layer 14 which emits white light, the display device may also have a structure provided with the organic EL layer 14 common between a plurality of pixels 10 as is shown in FIG. 4. In addition, the present embodiment is not limited to the structure shown in FIG. 4, in the case where the color of the light emitted by the organic EL layer 14 is different for each sub-pixel, a light emitting layer which emits light in each color may be formed by painting for each region above the first electrode 13 sectioned by the bank layer 16. At this time, only a light emitting layer of the organic EL layer 14 may be formed for each region sectioned by the bank layer 16, or other layers included in the organic EL layer 14 such as a hole injection layer, hole transport layer, electron transport layer, electron injection layer and so on may be formed as a common layer with all of the sub-pixels.

As is shown in FIG. 3A-3C, the first electrode 13 of the organic EL device 3 is provided for each sub-pixel above the TFT substrate 9. The first electrode 13 is formed for example by stacking a transparent electrode on aluminum or silver etch and forming a reflective electrode. The first electrode 13 is connected with each wiring of the TFT drive circuit layer 2 included in the TFT substrate 9 shown in FIG. 4 via the contact hole part 13c shown in FIG. 3A.

As is shown in FIG. 3A-3C and FIG. 4, the bank layer 16 is provided at a position which sections a light emitting region EA in which light is extracted from the organic EL device 2. In addition, the bank layer 16 is formed covering the first electrode 13 from above the TFT substrate 9 between a plurality of adjacent first electrodes 13 so that pairs of first electrodes 13 of adjacent sub-pixels do not short circuit and is formed so that the first electrode 13 in a part corresponding to the light emitting region EA is exposed. As is shown in FIG. 3B and FIG. 4, the bank layer 16 may also be formed including a convex cross-sectional shape.

The organic EL layer 14 is provided above the first electrode 13 exposed by the bank layer 16 as is shown in FIG. 4. The organic EL layer 14 is provided with a light emitting layer which emits white light in the present embodiment. The organic EL layer 14 is may provide as a layer common to all sub-pixels. A second electrode 15 comprised from a transparent conductive film such as ITO is provided above the organic EL layer 14 as a layer common to each sub-pixels.

A schematic structure of a pixel in a conventional organic EL display device is shown in FIG. 5 as a comparison with the organic EL display device 100 related to the first embodiment of the present invention. Referring to FIG. 5, in a conventional organic EL display device, a leak current path P2 is formed via a low resistance material included in the organic EL layer 14 between the first electrode 13 of adjacent sub-pixels. When a current leaks to the first electrode 13 of an adjacent sub-pixel due to the leak current path P2 in the organic EL layer 14, at the same time as when original light L1 is emitted by a normal current path P1, light P3 is also generated in an adjacent sub-pixel. In this way, mixing of colors L4 occurs between adjacent pixels due to normal light L1 and light L3 cause by a leak current being generated at the same time.

However, referring to FIG. 4, in the organic EL display device 100 of the present invention, a layer 14a which reduces the conductivity of the organic EL layer 14 is includes in a part of the organic EL layer 14 at a position where it is east for the leak current path P2 shown in FIG. 5 to occur. The layer 14a which reduces the conductivity of the organic EL layer 14 is a non-conductive part formed by irradiating an energy beam E1 on a part of the organic EL layer 14. In this way, the organic EL display device 100 of the present invention can prevent a current leak between sub-pixels via the organic EL layer 14 by including a plurality of non-conductive layers 14a having a higher resistance than a part (second region) where the organic EL layer 14 overlaps a plurality of first electrodes 13 in a part (first region) where the organic EL layer 14 overlaps a plurality of bank layers 16 positioned between adjacent sub-pixels.

A manufacturing process of the organic EL display device is explained in more detail below while referring to FIG. 6A-6F. FIG. 6A-6F are cross-sectional diagrams for explaining a manufacturing process of the organic EL display device 100.

Figure 6A:
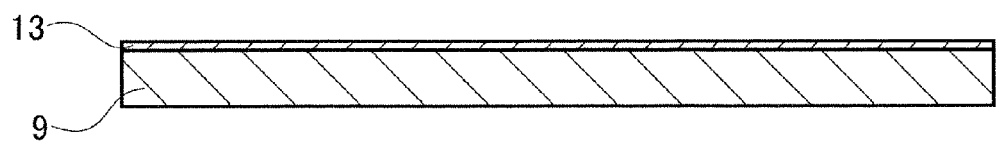
FIG. 6A-6F are cross-sectional diagrams for explaining a manufacturing process of an organic EL display device related to one embodiment of the present invention.
Figure 6B:
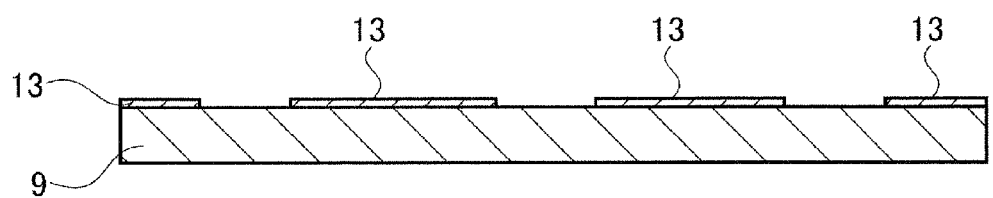

As is shown in FIG. 6A, the first electrode 13 including a reflecting layer is formed from aluminum, silver and so on above the TFT substrate 9 using a known method such as a sputtering method. The first electrode 13 is formed by patterning each electrode corresponding to a region of each sub-pixel as shown in FIG. 6B. The first electrode 13 is provided with light blocking properties as well as a reflective surface by including a reflecting layer using aluminum, silver and so on.

Figure 6C:
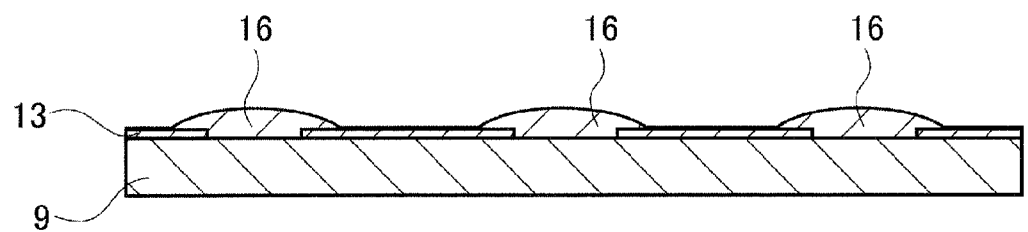

Next, as is shown in FIG. 6C, a bank layer 16 which sections a light emitting region EA of each sub-pixel is formed covering an end part of the first electrode 13 above the TFT substrate 9 between a plurality of the first electrodes 13. The bank layer 16 is formed as an insulation layer using an organic material such as polyimide or acrylic or an inorganic material such as silicon oxide. Patterning may be performed after forming the bank layer 16 on the entire surface of the TFT substrate 9 formed with the first electrode 13. In addition, the bank layer 16 may be formed so that the upper surface is provided with a smooth convex cross-sectional shape as is shown in FIG. 6C.

Figure 6D:
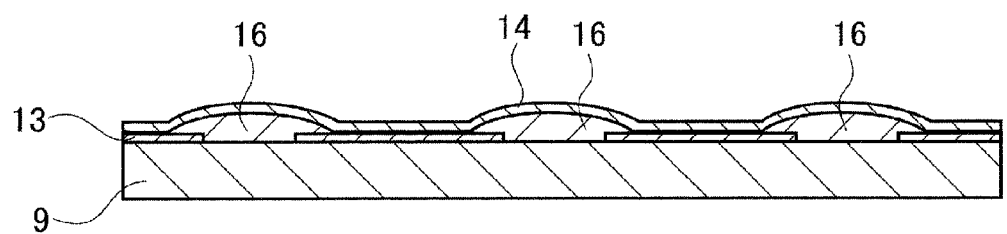

Next, as is shown in FIG. 6D, the organic EL layer 14 is formed above the bank layer 16 and the first electrode 13 using a known method such as a vacuum evaporation method. The organic EL layer 14 includes a light emitting layer which emits white light and is formed as a layer common the all the sub-pixels in the present embodiment.

However, as described above, in the case where the color which is emitted by the organic EL layer 14 for each sub-pixel is different, only a light emitting layer of the organic EL layer 14 may be formed for each region sectioned by the bank layer 16, or other layers included in the organic EL layer 14 such as a hole injection layer, hole transport layer, electron transport layer, electron injection layer and so on may be formed as a common layer with all of the sub-pixels.

Figure 6E:
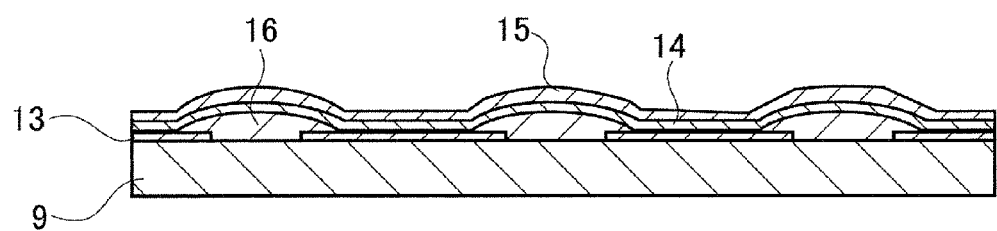

Next, as is shown in FIG. 6E, a second electrode 15 is formed above the organic EL layer 14. The second electrode 15 is formed using a transparent conductive film such as ITO or IZO using a known method such as a sputtering method or CVD method. The second electrode 15 is formed as a layer common to all sub-pixels in the present embodiment the same as the organic EL layer 14.

Figure 6F:
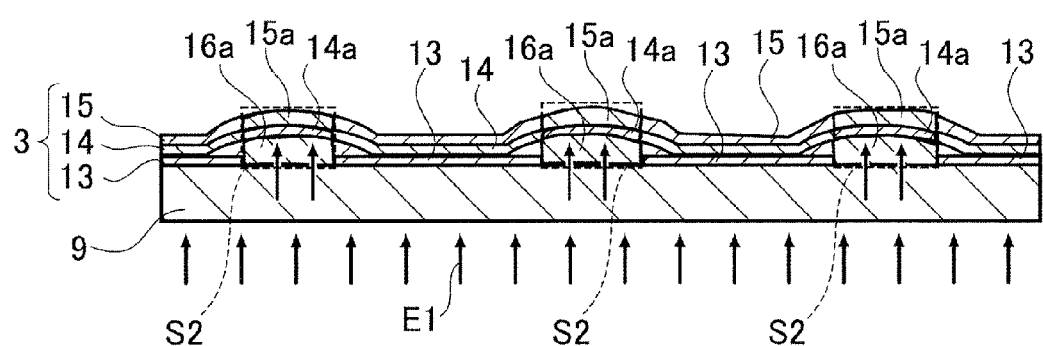

Next, as is shown in FIG. 6F, and energy beam E1 is irradiated from the rear surface side of the TFT substrate 9. At this time, since the first electrode 13 is formed including aluminum or silver metal layer or at least one single metal layer, this functions as a mask which blocks the energy beam E1. In this way, the energy beam E1 is irradiated onto the bank layer 16, organic EL layer 14 and second electrode 15 in a region which is not masked by the first electrode 13. Parts 16a, 14a, 15a which are irradiated by the energy beam E1 of the bank layer 16, organic EL layer 14 and second electrode 15 changes which changes the material properties of each layer respectively.

The organic EL layer 14 includes a layer formed for example using a conductive material such as a hole injection layer or charge generation layer. Therefore, when the energy beam E1 is irradiated from the rear surface side of the TFT substrate 9 using the first electrode 13 as a mask, the energy beam E1 is selectively irradiated to the organic EL layer 14 above the bank layer 16. In this way, the conductive layer included in the organic EL layer 14 positioned between sub-pixels is changed, the resistance of the part 14a irradiated with energy beam E1 is increased and it possible to form a non-conductive layer. By increasing the resistance of the organic EL layer 14 above the bank layer positioned between sub-pixels or by making the layer non-conductive, it is possible to prevent a current leaking to an adjacent sub-pixel via the conductive layer of the organic EL layer 14.

The energy beam E1 used in the present embodiment may be an ultraviolet (UV) light which deteriorates the organic atoms of the organic EL layer 14 and can make the irradiated part non-conductive, or infrared light which changes the organic atoms of the organic EL layer 14 using heat and can make the irradiated part non-conductive. In addition, the energy beam E1 may be an electron beam (EB) which breaks down the atom bonds of the organic EL layer 14 and can make the irradiated part non-conductive, or a high intensity white light beam which has a wide range wavelength and reaches the organic EL layer 14 by internal reflection even in complex layered structure within the TFT substrate 9.

In this way, it is possible to irradiate the energy beam E1 to not only the organic EL layer 14 but also the bank layer 16 and second electrode 15 by irradiating the energy beam E1 using the first electrode 13 as a mask from the rear surface side of the TFT substrate 9. In this way, either the transparent bank layer 16 or second electrode 15 or both positioned between sub-pixels is changed and it is possible to reduce translucency or preferably make them opaque. In this way, in the conventional display device, although there is a possibility that mixing colors L4 of light L1 and L3 may occur from the light L2 leaking towards the direction of an adjacent sub-pixel as is shown in FIG. 5, according to the manufacturing method of the organic EL display device 100 related to the present embodiment, it is possible to realize an organic EL display device 100 which can prevent mixing colors L4 by blocking leaking light L2 by reducing the translucency of the transparent bank layer 16 and second electrode 15 and forming a light shielding region 16a, 15a as is shown in FIG. 6F.

Here, the bank layer 16, organic EL layer 14 and second electrode 15 regions irradiated with the energy beam E1 and positioned between first electrodes 13 are shown enclosed by a dotted line in FIG. 6F. However, the range of the irradiated energy beam E1 is not limited to the range enclosed by the dotted line S2 shown in FIG. 6F. After the energy beam E1 is irradiated to the bank layer 16 at a position between the first electrodes 13, due to dispersion the energy beam E1 may be irradiated to a range larger than or smaller than the range enclosed by the dotted line S2.

In this way, it is possible to irradiate the energy beam E1 to the bank layer 16, organic layer 14 and second electrode 15 positioned between adjacent sub-pixels by self-alignment without using another mask by irradiating the energy beam E1 using the first electrode 13 as a mask from the rear surface side of the TF substrate 9. In this way, since it is possible to change the properties of the bank layer 16, organic layer 14 and second electrode 15 positioned between adjacent sub-pixels, as well as being able to block the leak current path P2 by making the organic EL layer 14 non-conductive, it is possible to reduce translucency of the transparent bank layer 16 and second electrode 15 and block the leaking light L2 path by forming the light shielding regions 16a and 15a After forming the organic EL device 3 by arranging a structure in which the first electrode 13, organic EL layer 14 and second electrode 15 are stacked, and after forming the non-conductive layer 14a in a part of the organic EL layer 14 positioned between sub-pixels, a transparent sealing film 4 which covers the entire surface of the organic EL device 3 is formed using a known method such as a CVD method using a material such as silicon nitride.

As is shown in FIG. 2 and FIG. 4, the second substrate 12 provided with a color filter 17 and black matrix 18 is bonded above the sealing film 4 of the first substrate 11 via a dam material 5 and filler material 6. In this way, the organic EL display device 100 related to the first embodiment of the present invention is formed.

Although a process of irradiating the energy beam E1 after forming the second electrode 15 is shown in FIG. 6F during the manufacturing process of the organic EL display device 100 related to the first embodiment of the present invention shown in FIG. 6A-6F, the energy beam E1 may be irradiated after forming the sealing film 4 or irradiated after bonding the second substrate 12 to the first substrate 11. The manufacturing process of this type of organic EL display device 100 is explained while referring to FIG. 7 and FIG. 4 respectively.

FIG. 7 is a cross-sectional diagram for explaining another example of a manufacturing process of the organic EL display device 100 related to the first embodiment of the present invention. As is shown in FIG. 7, after forming the sealing film 4 to cover the entire surface of the organic EL device 3, the energy beam E1 is irradiated from the rear surface side of the TFT substrate 9 using the first electrode 13 as a mask. In this way, it is possible for the energy beam E1 to be irradiated in a region between first electrodes 13 shown by the dotted line S3 in FIG. 7 and change the properties of the bank layer 16, organic EL layer 14, second electrode 15 and sealing film 4. That is, as well as being able to make the conductive layer of the organic EL layer 14 non-conductive, it is also possible to reduce the translucency of the transparent bank layer 16, second electrode 15 and sealing film 4 and form the light shielding regions 16a, 15a and 4a. Therefore, it is possible to block the leak current path P2 to an adjacent sub-pixel and block the path of the leaking light L2.

In addition, as is shown in FIG. 4, the energy beam E1 may be irradiated from the rear surface side of the TFT substrate 9 using the first electrode 13 as a mask after bonding the second substrate 12 to the first substrate 11 via the filler material 6. In this way, it is possible for the energy beam E1 to be irradiated in a region between first electrodes 13 shown by the dotted line S1 in FIG. 4 and change the properties of the bank layer 16, organic EL layer 14, second electrode 15, sealing film 4 and filler material 6. That is, as well as being able to make the conductive layer of the organic EL layer 14 non-conductive, it is also possible to reduce the translucency of the transparent bank layer 16, second electrode 15, sealing film 4 and filler material 6 and form light shielding regions. Therefore, it is possible to block the leak current path P2 to an adjacent sub-pixel and block the path of the leaking light L2.

As described above, according to the manufacturing process of the organic EL display device 100 related to the first embodiment of the present invention, it is possible to prevent a current leak between fine pixels and improve yield by preventing the mixing of color of pixels using an easy manufacturing process.

Second Embodiment

The structure and manufacturing process of the organic EL display device 100 related to a second embodiment of the present invention is explained below while referring to FIG. 8 to FIG. 10.

Figure 8:
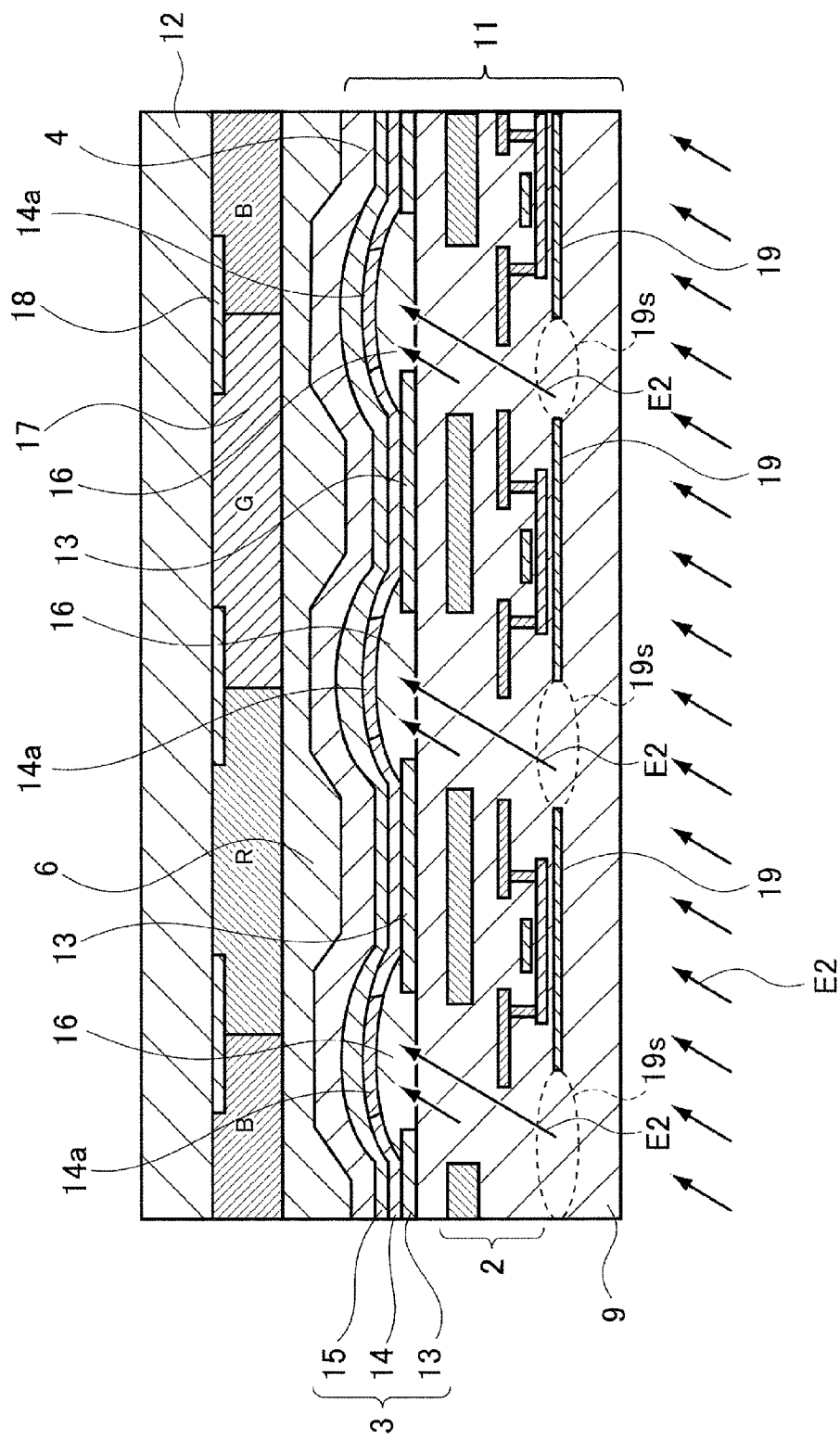
FIG. 8 is a cross-sectional diagram showing a schematic structure of a pixel in an organic EL display device related to one embodiment of the present invention.
Figure 9A:
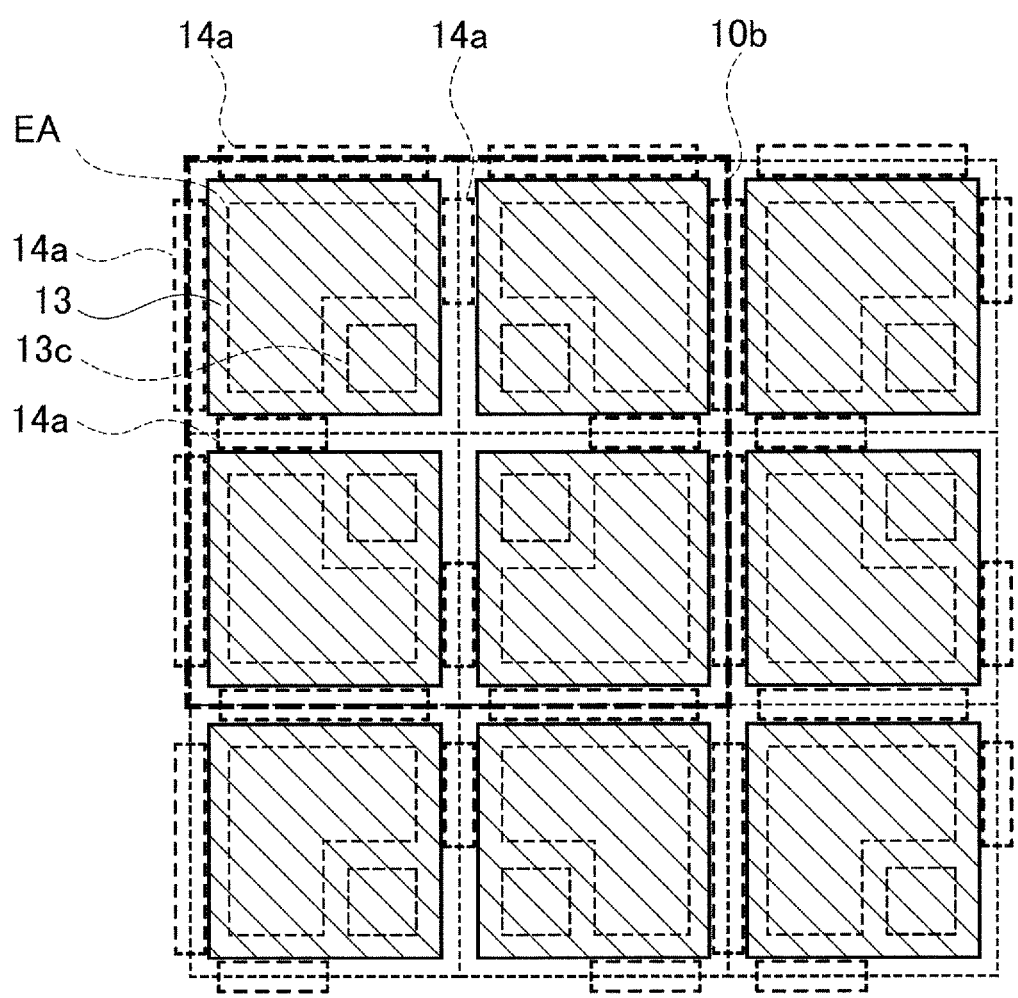
FIG. 9A is a planar diagram showing a schematic structure of a pixel in an organic EL display device related to one embodiment of the present invention.
Figure 9B:
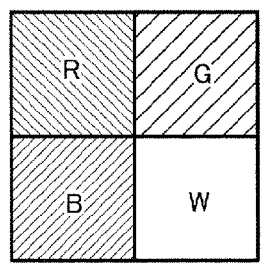
FIG. 9B is a planar diagram showing a structure of a pixel comprised from sub-pixels in an organic EL display device related to one embodiment of the present invention.

FIG. 8 is a cross-sectional diagram showing a schematic structure of a pixel 10 in the organic EL display device 100 related to the second embodiment of the present invention. FIG. 9A is a diagram showing a schematic structure of a pixel 10b in the organic EL display device 100 related to the second embodiment of the present invention. FIG. 10 is planar diagram showing a schematic structure of the organic EL display device 100 related to the second embodiment of the present invention The organic EL display device 100 related to the second embodiment of the present invention has a different manufacturing process and structure compared to the organic EL display device 100 related to the first embodiment of the present invention in that the non-conductive later 14a of the organic EL layer 14 is formed by irradiating an energy beam E2 from the rear surface side of the TFT substrate 9 using a shield layer 19 included in the TFT substrate 9. Therefore, detailed explanations of the same structure and manufacturing process as the organic EL display device 100 related to the first embodiment described above are omitted below.

Figure 10:
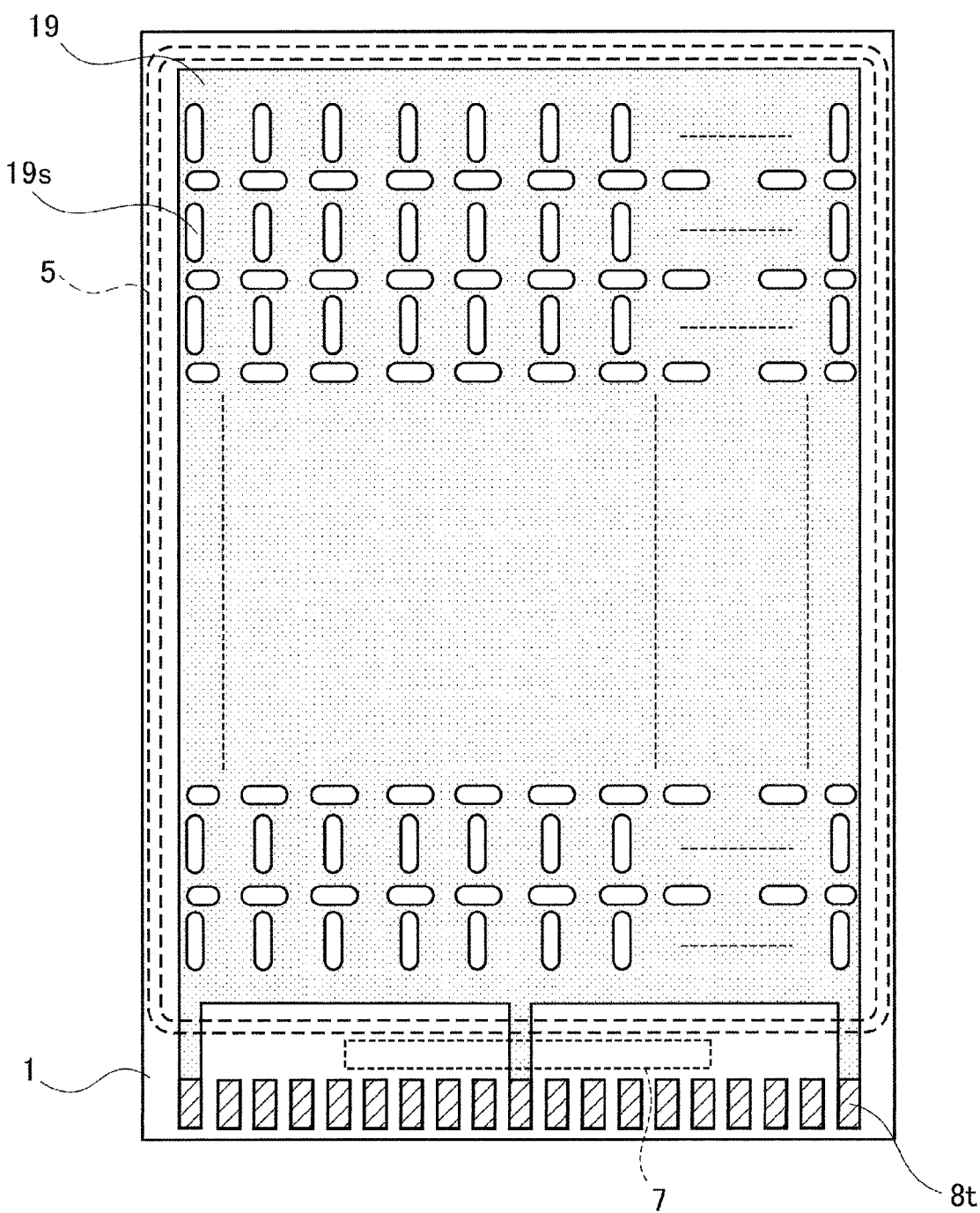
FIG. 10 is a planar diagram showing a schematic structure of an organic EL display device related to one embodiment of the present invention.

The shield layer 19 includes a plurality of slits 19s as is shown in FIG. 8 and FIG. 10. The shield layer 19 is a metal layer provided below a TFT drive circuit layer 2 of the TFT substrate 9 and, for example, may be used as wiring for supplying power to a thin film transistor of the TFT drive circuit layer 2 or used as a capacitance electrode. The shield layer 19 is formed using a metal material with light blocking properties so as to function as a mask when irradiating the energy beam E2. In the case where the shield layer 19 is used as wiring or a capacitance electrode, the shield layer 19 may be provided connected with a terminal 8t of a FPC 8. In addition, the plurality of slits 19s may be formed when patterning the shield layer 19 when functioning as wiring or provided in order to relieve stress or dissipate heat.

As is shown in FIG. 10, the shield layer 19 may be formed above the substrate 1 shown in FIG. 2 in the TFT substrate 9. A plurality of thin film transistors are formed above the shield layer 9 via an insulation layer. The shield layer 9 may be connected to the plurality of thin film transistors respectively via a plurality of contact holes formed in the insulation layer. A plurality of first electrodes 13 are further formed via the insulation layer above the plurality of thin film transistors. The plurality of thin film transistors and plurality of first electrodes 13 are respectively connected via the contact holes formed in the insulation layer. The organic EL layer 14 and second electrode 15 are stacked in order above the plurality of first electrodes 13.

As is shown in FIG. 8, when the energy beam E2 is irradiated from the rear surface side of the TFT substrate 9, the shield layer 19 becomes a mask and the energy beam E2 is irradiated to the organic EL layer 14 above the bank layer 16 after passing through the plurality of slits 19s. At this time, the energy beam E2 may be irradiated at an incline as is shown in FIG. 8 or irradiated a plurality of times while changing the inclination angle. By adjusting the irradiation angle of the energy E2, it is possible to increase the resistance of a part of the organic EL layer 14 at a desired position or make a part of the organic EL layer 14 non-conductive. The irradiation angle of the energy beam E2 may be adjusted so as that it is possible to form a non-conductive layer 14a of the organic EL layer 14 at a desired position of the organic EL layer 14 by reflecting, refracting or dispersing the energy beam E2 within the TFT substrate 9.

In addition, the plurality of slits 19s of the shield layer 19 shown in FIG. 10 may be formed corresponding to a position where the non-conductive layer 14a of the organic EL layer 14 is formed. The size of the slits 19s of the shield layer 19 may be larger than a region where the non-conductive layer 14a is formed. In this way, it becomes easier to selectively irradiate the energy beam at a desired position of the organic EL layer 14. Here, a position where the non-conductive layer 14a of the organic EL layer 14 is formed is shown by the dotted line 14a in FIG. 9A. In addition, an example structure of a plurality of RGBW square pixels 10b comprised from four sub-pixels red (R), green (G), blue (B) and white (W) provided in a matrix shape is shown in FIG. 9A. As is shown in FIG. 9A, the non-conductive layer 14a of the organic EL layer 14 is formed in a position where the light emitting regions EA of adjacent pixels are close to each other between first electrodes 13 of adjacent sub-pixels.

In this way, by arranging each of the plurality of slits 19s of the shield layer 19 corresponding to each position where the non-conductive layer 14a of the organic EL layer 14 is formed respectively which is a position where the light emitting regions EA of adjacent pixels are close to each other, the energy beam E2 irradiated from the rear surface side of the TFT substrate 9 is irradiated passing through the plurality of slits 19s at the stacked part of the bank layer 16, organic EL layer 14, second electrode 15 and sealing film 4 positioned between sub-pixels. In this way, even in the organic EL display device 100 related to the second embodiment of the present invention, it is possible to change the properties not only of the organic EL layer 14 but also the bank layer 16, second electrode 14 and sealing film 4 the same as the organic EL display device 100 related to the first embodiment. That is, as well as being able to make the conductive layer of the organic EL layer 14 non-conductive, it is possible to form a light shielding region which reduces the translucency of a part of the transparent bank layer 16, second electrode 15 and sealing film 4. Therefore, it is possible to block the leak current path P2 to an adjacent pixel and block a leaking light L2 path.

In addition, when the energy beam E2 is irradiated an at incline as in the present embodiment, because the shield layer 19 is provided below the TFT drive circuit layer 2 of the TFT substrate 9, the energy beam E2 may be irradiated to the thin film transistors included in the TFT drive circuit layer 2. However, it is possible to discharge an electrical charge to a thin film transistor during the manufacturing process by irradiating the energy beam E2 to the thin film transistor. Therefore, according to the organic EL display device 100 related to the second embodiment of the present invention, it is possible to demonstrate not only the effect of preventing a current leaking between sub-pixels but also the effect of discharging an unnecessary electrical charge to a charged thing film transistor.

As described above, according to the organic EL display device 100 related to the first and second embodiments of the present invention, it is possible to prevent a current leak between fine pixels and achieve an improvement in yield by preventing mixing colors between pixels. In addition, it is possible to realize this type of organic EL display device 100 by a simple manufacturing process without using another mask by irradiating the energy beams E1 and E2 in self-alignment.

What is claimed is:

1. An organic electroluminescence (EL) display device comprising:
    a plurality of first electrodes provided corresponding to each of a plurality of pixels above a first substrate;
    a bank layer provided above the first substrate and located at a boundary between a pair of the first electrodes which are adjacent to each other to cover end parts of the pair of the first electrodes;
    an organic EL layer provided to cover the plurality of first electrodes and the bank layer; and
    a second electrode provided above the organic EL layer;
    wherein the organic EL layer includes a first region overlapping the bank layer, and a second region overlapping the plurality of the first electrodes; and
    a first resistance of the first region is larger than a second resistance of the second region,
    one of the bank layer and the second electrode includes a light shielding region in an area overlapping the first region, and
    a translucency of the light shielding region is lower than that of a region of the one of the bank layer and the second electrode, the region being different from the light shielding region.

2. The organic EL display device according to claim 1, wherein both the bank layer and the second electrode include the light shielding region.

3. The organic EL display device according to claim 1, wherein a sealing film is further provided above the second electrode, the sealing film including a second light shielding region in an area overlapping the first region, and
    a translucency of the second light shielding region is lower than that of a region of the sealing film, the region being different from the second light shielding region.

4. The organic EL display device according to claim 1, wherein a second substrate is provided facing the first substrate, and a resin layer is further provided between the first substrate and the second substrate and overlapping the first region and the second region, the resin layer including a third light shielding region in an area overlapping the first region, and
    a translucency of the third light shielding region is lower than that of a region of the resin layer, the region being different from the third light shielding region.

5. An organic electroluminescence (EL) display device comprising:
    a first substrate;
    a first pixel and a second pixel adjacent to the first pixel provided in the first substrate;
    a first pixel electrode provided in the first pixel;
    a second pixel electrode provided in the second pixel;
    a bank layer located at a boundary between the first pixel and the second pixel, the bank layer exposing the first pixel electrode and the second pixel electrode;
    an organic EL layer provided across the first pixel, the second pixel and the bank layer;
    a common electrode provided above the organic EL layer and across the first pixel, the second pixel and the bank layer; and
    a thin film transistor provided between the first substrate and the first pixel electrode,
    wherein the organic EL layer includes a first region overlapping the bank layer and a second region overlapping the first pixel electrode in a planar view, and
    a resistance of the first region is larger than a second resistance of the second region,
    a metal layer covering a semiconductor layer of the thin film transistor is provided between the first substrate and the thin film transistor, and
    the metal layer includes a plurality of slits corresponding to the first region.

6. The organic EL display device according to claim 5, wherein a terminal is provided in the first substrate and the metal layer is connected to the terminal.

7. The organic EL display device according to claim 5, wherein the first pixel includes a first light emitting region, the second pixel includes a second light emitting region,
    a boundary between the first light emitting region and the second light emitting region includes a first boundary portion having a first spaced gap and a second boundary portion having a second spaced gap, the second spaced gap smaller than the first spaced gap,
    the first spaced gap is a distance from a first edge of the first light emitting region to a second edge of the second light emitting region, the second edge facing the first edge,
    the second spaced gap is a distance from a third edge of the first light emitting region to a fourth edge of the second light emitting region, the third edge being different from the first edge, the fourth edge facing the third edge, and
    the first region is overlapped with the second boundary portion in a planar view.

8. The organic EL display device according to claim 5, wherein the bank layer includes a light shielding region in an area overlapping the first region, and
    a translucency of the light shielding region is lower than that of a region of the bank layer, the region being different from the light shielding region.

9. The organic EL display device according to claim 5, wherein the common electrode includes a light shielding region in an area overlapping the first region, and a translucency of the light shielding region is lower than that of a region of the common electrode, the region being different from the light shielding region.

10. The organic EL display device according to claim 5, wherein a sealing film is further provided above the common electrode, the sealing film including a light shielding region in an area overlapping the first region, and a translucency of the light shielding region is lower than that of a region of the sealing film, the region being different from the light shielding region.

11. The organic EL display device according to claim 5, wherein a second substrate is provided facing the first substrate, a sealing film is further provided above the common electrode, and a filler material is further provided above the sealing film, the filler material including a light shielding region in an area overlapping the first region, and a translucency of the light shielding region is lower than that of a region of the filler material, the region being different from the light shielding region.

12. An organic electroluminescence (EL) display device comprising:
   a first substrate;
   a first pixel and a second pixel adjacent to the first pixel provided in the first substrate;
   a first pixel electrode provided in the first pixel;
   a second pixel electrode provided in the second pixel;
   a bank layer located at a boundary between the first pixel electrode and the second pixel electrode, the bank layer exposing the first pixel electrode and the second pixel electrode;
   an organic EL layer provided across the first pixel, the second pixel and the bank layer; and
   a common electrode provided above the organic EL layer and across the first pixel, the second pixel and the bank layer;
   wherein the organic EL layer includes a first region overlapping the bank layer and a second region overlapping the first pixel electrode in a planar view; and
   a resistance of the first region is larger than a resistance of the second region,
   the first pixel includes a first light emitting region,
   the second pixel includes a second light emitting region,
   a boundary between the first light emitting region and the second light emitting region includes a first boundary portion having a first spaced gap and a second boundary portion having a second spaced gap, the second spaced gap smaller than the first spaced gap,
   the first spaced gap is a distance from a first edge of the first light emitting region to a second edge of the second light emitting region, the second edge facing the first edge,
   the second spaced gap is a distance from a third edge of the first light emitting region to a fourth edge of the second light emitting region, the third edge being different from the first edge, the fourth edge facing the third edge, and
   the first region is overlapped with the second boundary portion and is not overlapped with the first boundary portion in a planar view.

13. The organic EL display device according to claim 12, wherein one of the bank layer and the common electrode includes a light shielding region in an area overlapping the first region, and a translucency of the light shielding region is lower than that of a region of the one of the bank layer and the common electrode, the region being different from the light shielding region.

14. The organic EL display device according to claim 12, wherein a sealing film is further provided above the common electrode, the sealing film including a light shielding region in an area overlapping the first region, and a translucency of the light shielding region is lower than that of a region of the sealing film, the region different from the light shielding region.

* * * * *